(12) United States Patent
Kim et al.

(10) Patent No.: US 11,229,117 B1
(45) Date of Patent: Jan. 18, 2022

(54) PRINTED CIRCUIT BOARD

(71) Applicant: SAMSUNG ELECTRO-MECHANICS CO., LTD., Suwon-si (KR)

(72) Inventors: Jung Soo Kim, Suwon-si (KR); Jin Won Lee, Suwon-si (KR); Woo Seok Jeon, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 17/159,793

(22) Filed: Jan. 27, 2021

(30) Foreign Application Priority Data

Nov. 3, 2020 (KR) .......................... 10-2020-0145285

(51) Int. Cl.
*H05K 1/11* (2006.01)
*H05K 1/03* (2006.01)

(52) U.S. Cl.
CPC .......... *H05K 1/115* (2013.01); *H05K 1/0353* (2013.01); *H05K 2201/0959* (2013.01)

(58) Field of Classification Search
CPC ...... H05K 1/0353; H05K 1/115; H05K 1/116; H05K 1/117; H05K 2201/0959; H05K 2201/09581; H05K 2201/096; H05K 2201/09627; H05K 2201/09645; H05K 2201/09727; H05K 2201/09745; H05K 2201/098; H05K 2201/09854; H05K 1/118
See application file for complete search history.

(56) References Cited

U.S. PATENT DOCUMENTS

| | | | |
|---|---|---|---|
| 2001/0009066 A1* | 7/2001 | Bhatt | H05K 3/4069 29/846 |
| 2008/0277155 A1* | 11/2008 | Horiuchi | H05K 3/4602 29/846 |
| 2013/0098665 A1* | 4/2013 | Ishii | H05K 1/09 174/254 |
| 2015/0934378 | 2/2015 | Kajihara et al. | |
| 2019/0357364 A1* | 11/2019 | Lutschounig | H05K 1/0206 |
| 2020/0168541 A1* | 5/2020 | Tanaka | H05K 1/115 |

FOREIGN PATENT DOCUMENTS

| | | |
|---|---|---|
| JP | 2001-15920 A | 1/2001 |
| JP | 2015-029027 A | 2/2015 |

* cited by examiner

*Primary Examiner* — Roshn K Varghese
(74) *Attorney, Agent, or Firm* — Morgan, Lewis & Bockius LLP

(57) ABSTRACT

A printed circuit board includes: an insulating layer having one surface and the other surface; metal layers respectively disposed on the one surface and the other surface of the insulating layer; a through-hole penetrating through the insulating layer and the metal layers; a first plating layer disposed in a center portion of the through-hole in a thickness direction thereof; and a plug disposed in the through-hole.

18 Claims, 5 Drawing Sheets

PRINTED CIRCUIT BOARD

CROSS-REFERENCE TO RELATED APPLICATION(S)

This application claims benefit of priority to Korean Patent Application No. 10-2020-0145285 filed on Nov. 3, 2020 in the Korean Intellectual Property Office, the disclosure of which is incorporated herein by reference in its entirety.

TECHNICAL FIELD

The present disclosure relates to a printed circuit board.

BACKGROUND

Due to the recent high-speed data processing and increases in data volume, demand for flip-chip ball grid array (FCBGA) substrates has increased in various markets, even in fields other than that of the existing central processing unit (CPU) market, and product structures have been diversified from a conventional CPU-focused product structures into various product structures. According to the diversification of products, there are demands for package substrates of various designs, and each layer in the substrate also has a higher density in design as compared with that in the conventional product.

Concerning a 2.5D package product that is a server for which demand has recently increased in particular, input/output terminals (I/O) and memories are added thereto, and accordingly, a size of a substrate is increasing. However, the increase in the size of the substrate may cause a problem in which voids may occur.

SUMMARY

An aspect of the present disclosure may provide a printed circuit board that is advantageous in preventing occurrence of voids in a through-hole.

Another aspect of the present disclosure may provide a printed circuit board in which a plating area in a through-hole is increased to improve reliability at the time of transmitting signals.

One of several solutions suggested through the present disclosure may be to provide a printed circuit board having a thick core in which a plug is disposed in a through-hole using a bridge plating technique in order to address voids or unfilled areas that may be generated at the time of plugging the through-hole.

According to an aspect of the present disclosure, a printed circuit board may include: an insulating layer having one surface and the other surface; metal layers respectively disposed on the one surface and the other surface of the insulating layer; a through-hole penetrating through the insulating layer and the metal layers; a first plating layer disposed in the through-hole to divide the through-hole into first and second areas; and a plug disposed in the through-hole.

According to another aspect of the present disclosure, a printed circuit board may include: an insulating layer; a plurality of through-holes penetrating through the insulating layer; a plurality of plugs disposed in the plurality of through-holes, respectively; and a first plating layer penetrating through each of the plurality of plugs.

According to another aspect of the present disclosure, a printed circuit board may include: an insulating layer; a through-hole penetrating through the insulating layer; a conductive layer disposed at least in the through-hole; a first plug and a second plug disposed in the through-hole and separated from each other by the conductive layer; and a metal layer disposed on one or more of the first plug and the second plug.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will now be described in detail with reference to the accompanying drawings.

In the present disclosure, the expression "side portion", "side surface", or the like is used to refer to a left or right direction or a surface in that direction based on the drawings for convenience, the expression "upper side", "upper portion", "upper surface", or the like is used to refer to an upward direction or a surface in that direction based on the drawings for convenience, and the expression "lower side", "lower portion", "lower surface", or the like is used to refer to a downward direction or a surface in that direction based on the drawings for convenience. In addition, the expression "positioned on the side portion, the upper side, the upper portion, the lower side, or the lower portion" conceptually includes a case in which a target component is positioned in a corresponding direction but is not in direct contact with a reference component, as well as a case in which the target component is in direct contact with the reference component in the corresponding direction. However, these directions are defined for convenience of explanation, and the claims are not particularly limited by the directions defined above, and the concepts of the upper and lower portions, sides and surfaces may be changed.

Figure 1:
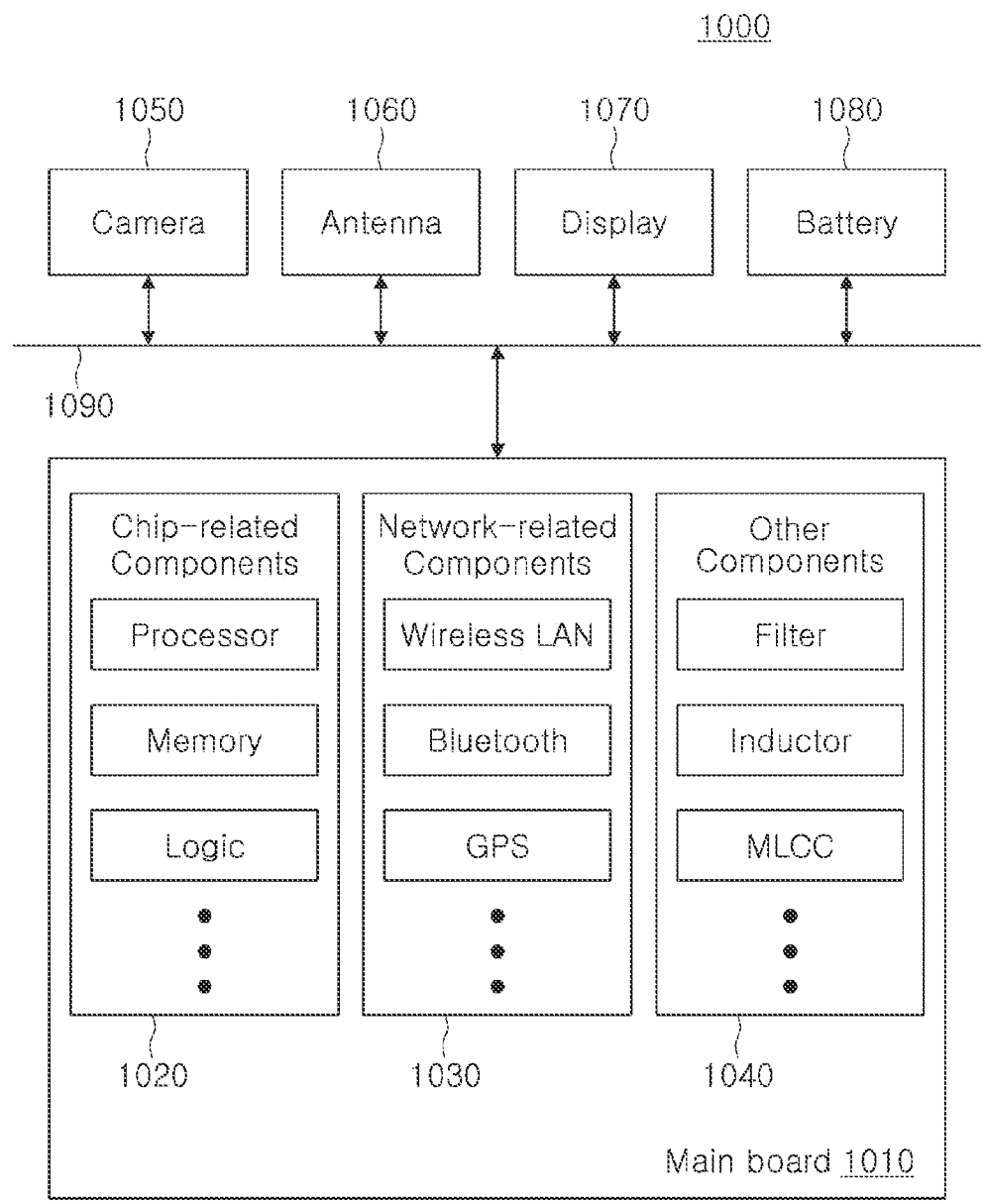
FIG. 1 is a block diagram schematically illustrating an example of an electronic device system.

FIG. 1 is a block diagram schematically illustrating an example of an electronic device system.

Referring to FIG. 1, an electronic device 1000 may accommodate a main board 1010 therein. Chip-related components 1020, network-related components 1030, and other components 1040 may be physically and/or electrically connected to the main board 1010. These components may also be coupled to other electronic components, which will be described later, to form various signal lines 1090.

The chip-related components 1020 may include: a memory chip such as a volatile memory (e.g. a dynamic random access memory (DRAM)), a non-volatile memory (e.g. a read only memory (ROM)), or a flash memory; an application processor chip such as a central processor (e.g. a central processing unit (CPU)), a graphics processor (e.g. a graphics processing unit (GPU)), a digital signal processor, a cryptography processor, a microprocessor, or a microcontroller; and a logic chip such as an analog-to-digital converter or an application-specific integrated circuit (ASIC). However, the chip-related components 1020 are not limited thereto, and may include any other types of chip-related components. Also, these chip-related components may also be combined with each other. The chip-related component may be in the form of a package including the above-described chip.

The network-related components 1030 may include wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LIE), evolution data only (Ev-DO), high speed packet access+(HSPA+), high speed downlink packet access+ (HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G, and any other wireless and wired protocols designated thereafter. However, the network-related components 1030 are not limited thereto, and may include any other wireless or wired standards or protocols. Also, the network-related component 1030 may be provided in the form of a package in combination with the chip-related component 1020.

The other components 1040 may include a high-frequency inductor, a ferrite inductor, a power inductor, ferrite beads, low-temperature co-firing ceramics (LTCC), an electro-magnetic interference (EMI) filter, a multi-layer ceramic condenser (MLCC), and the like. However, the other components 1040 are not limited thereto, and may include passive elements in the form of chip components used for various other purposes. Also, the other component 1040 may be provided in the form of a package in combination with the chip-related component 1020 and/or the network-related component 1030.

The electronic device 1000 may include any other electronic components that may be or may not be physically and/or electrically connected to the main board 1010 according to the type of electronic device 1000. Examples of the other electronic components may include a camera 1050, an antenna 1060, a display 1070, and a battery 1080. However, the other electronic components are not limited thereto, and may be an audio codec, a video codec, a power amplifier, a compass, an accelerometer, a gyroscope, a speaker, a mass storage device (e.g. a hard disk drive), a compact disc (CD), and a digital versatile disc (DVD). Also, the electronic device 1000 may include any other electronic components used for various purposes according to the type of electronic device 1000.

The electronic device 1000 may be a smartphone, a personal digital assistant, a digital video camera, a digital still camera, a network system, a computer, a monitor, a tablet, a laptop, a netbook, a television, a video game machine, a smart watch, or an automotive component. However, the electronic device 1000 is not limited thereto, and may be any other electronic device processing data.

Figure 2:
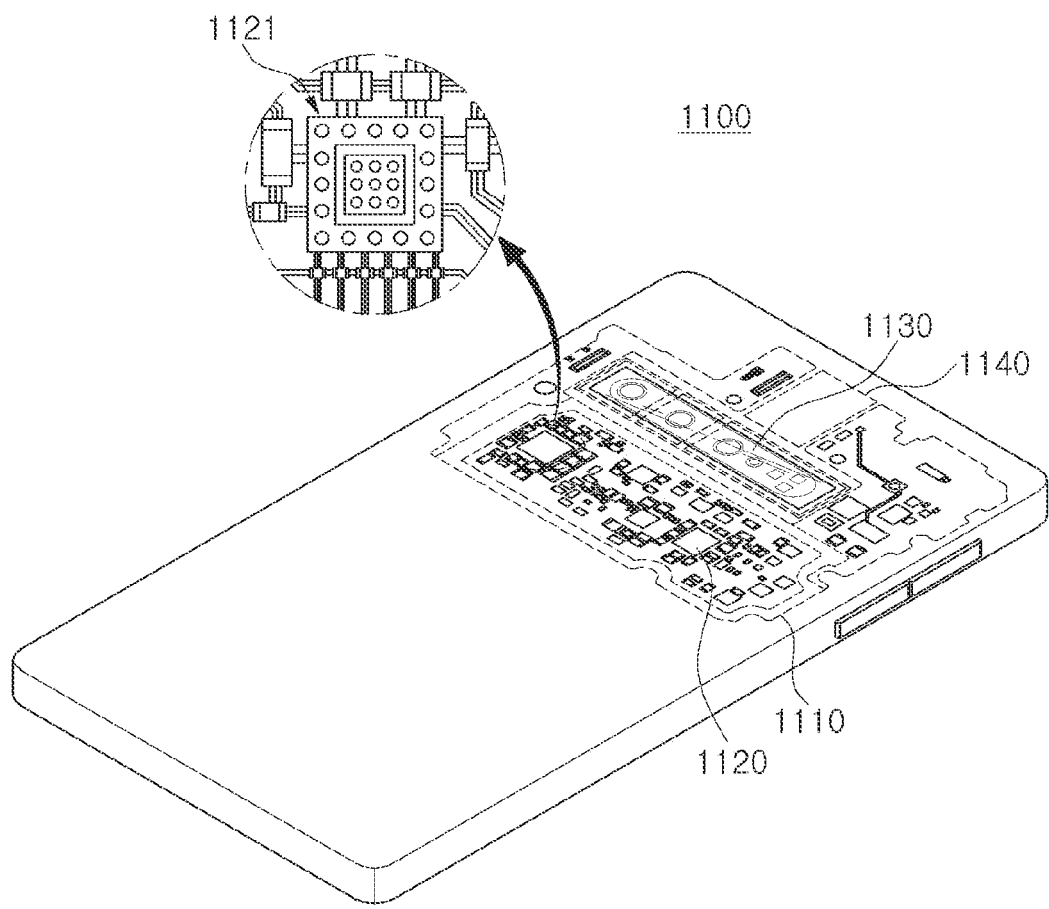
FIG. 2 is a perspective view schematically illustrating an example of an electronic device.

FIG. 2 is a perspective view schematically illustrating an example of an electronic device.

Referring to FIG. 2, the electronic device may be, for example, a smartphone 1100. A motherboard 1110 may be accommodated in the smartphone 1100, and various electronic components 1120 may be physically and/or electrically connected to the motherboard 1110. Also, a camera 1130 and/or a speaker 1140 and the like may be accommodated in the smartphone 1100.

Some of the electronic components 1120 may be the above-described chip-related components, for example, electronic component-embedded substrates 1121, but are not limited thereto. The electronic component-embedded substrate 1121 may be in a type in which an electronic component is embedded in a multilayer printed circuit board, but is not limited thereto. Meanwhile, the electronic device is not necessarily limited to the smartphone 1100, and may be another electronic device as described above.

Printed Circuit Board

Figure 3:
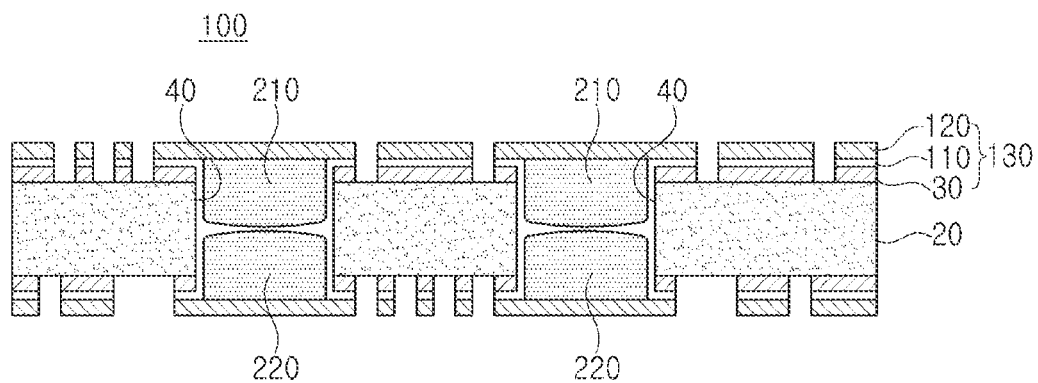
FIG. 3 is a cross-sectional view schematically illustrating a structure of a printed circuit board according to an exemplary embodiment in the present disclosure.

FIG. 3 is a cross-sectional view schematically illustrating a structure of a printed circuit board according to an exemplary embodiment in the present disclosure.

Referring to FIG. 3, the printed circuit board 100 according to the exemplary embodiment may include an insulating layer 20, metal layers 30 disposed on one surface and the other surface of the insulating layer, a through-hole 40 penetrating through the insulating layer 20 and the metal layers 30, first plating layers 110 disposed in the through-hole 40, for example, in a center portion of the through-hole 40, on an inner wall of the through-hole 40, and on the respective metal layers 30, plugs 210 and 220 disposed on the first plating layers 110 in the through-hole 40, and second plating layers 120 disposed on the plugs 210 and 220 and the first plating layers 110, respectively.

In the printed circuit board 100 according to the exemplary embodiment, according to a process to be described later, the plugs 210 and 220 may be separately disposed in two areas, respectively, into which the area in the through-hole 40 is divided by the first plating layers 110. Accordingly, generation of voids or unfilled areas can be effectively prevented, as compared with that when a plug is disposed in a lump in the through-hole 40. The plugs 210 and 220 may be disposed by individually performing plugging.

Meanwhile, in the printed circuit board 100 according to the exemplary embodiment, according to the process to be described later, the first plating layer 110 may be disposed in the center portion of the through-hole 40 in a thickness direction T thereof, as compared with a structure in which a through-hole is filled only with a plug or plugs. The first plating layer 110 may be disposed not only in the center portion of the through-hole 40 in the thickness direction T but also on the inner wall of the through-hole 40, and may extend to be disposed on the metal layer 30 as well. This structure makes it possible to increase a plating area inside the through-hole 40, thereby improving a signal transmission speed and reliability, as compared with the structure in which the through-hole is filled only with a plug or plugs.

Meanwhile, in the printed circuit board 100 according to the exemplary embodiment, according to the process to be described later, the first plating layer 110 may be disposed to have a thickness that is smallest in a center portion of the through-hole 40 in a width direction thereof. The first plating layer 110 according to the present disclosure may be formed by pulse periodical reverse (PPR) plating, in which a direction of a pulse current is periodically reversed, as will be described later. Accordingly, the first plating layer 110 may have a structure in which plating is performed from the inner wall of the through-hole 40 up to the center portion of the through-hole 40 in the width direction thereof. Based thereon, the first plating layer 110 may be disposed to divide the through-hole 40 into two areas. In the area where the first plating layer 110 is disposed in the through-hole 40, plating may be performed the least in the center portion of the through-hole 40 in the width direction thereof. Thus, the first plating layer 110 may be thinner in the center portion of the through-hole 40 in the width direction thereof than in the other portion of the through-hole 40 in the width direction thereof.

Hereinafter, the structure of the printed circuit board 100 according to the present disclosure will be described in more detail.

In the printed circuit board 100 according to the present disclosure, the insulating layer 20 may be disposed as a part of a core substrate 10 to perform a core function. The core substrate 10 may be a copper clad laminate (CCL), and may be in a type in which copper foil layers are laminated as thin metal layers 30 on both sides of the insulating layer 20. The insulating layer 20 may have a structure in which a plurality of through-holes 40 penetrate therethrough. In addition, although FIG. 3 illustrates that one insulating layer 20 is disposed, but a plurality of insulating layers may be disposed by laminating a plurality of build-up layers.

A material of the insulating layer 20 may be, for example, a thermosetting resin such as an epoxy resin, a thermoplastic resin such as polyimide, or a resin in which the thermosetting resin or the thermoplastic resin is mixed with an inorganic filler or impregnated together with the inorganic filler in a glass fiber, glass cloth, or glass fabric, e.g. prepreg, Ajinomoto build-up film (ABF), FR-4, or bismaleimide triazine (BT), or may include a photo image-able dielectric (PID). However, the material of the insulating layer 20 is not limited thereto as long as it is a material that may be used as a common insulating material.

The through-hole 40 is formed to penetrate through the core substrate 10 including the insulating layer 20 and the metal layers 30. A plurality of through-holes 40 may be formed in the core substrate 10 if necessary. The through-hole 40 may be formed by a common through-hole or via hole processing method, and a mechanical drilling technique such as a router or a bit may be used therefor. In the present disclosure in which the thick core substrate 10 is processed, the through-hole 40 may be formed through computer numerical control (CNC) drilling. The CNC drilling makes the through-hole 40 to substantially have a relatively constant cross-sectional area, width, or diameter in the thickness direction T thereof, as compared with laser processing by which the through-hole 40 has a tapered shape or an hourglass shape.

The first plating layers 110 may extend from the inner wall of the through-hole 40 to the respective metal layers 30 to be disposed thereon, and may also be disposed in the center portion of the through-hole 40 in the thickness direction T thereof. The first plating layers 110 may be formed using a pulse periodical reverse (PPR) plating technique, in which a direction of a pulse current is periodically reversed, and may be disposed by pulse plating after electroless plating because the first plating layers 110 need to be disposed on the insulating layer 20. Accordingly, the first plating layer 110 may include both a seed layer, which is an electroless plating layer, and a PPR plating layer. By forming the first plating layer 110 through PPR plating, the first plating layer 110 may include very large-size crystal grains.

In contrast to chemical copper plating such as electroless plating, electrolytic plating makes it possible to control a reaction rate of the system by adjusting a given current density and to easily select an amount of reaction driving force by adjusting an electrode potential. A waveform of a current used for electroplating the first plating layer 110 according to the present disclosure may be a cathodic pulse appearing during a period of no current or by an anodic pulse, a direct current having superimposed modulation, a series of cathodic pulses by a series of anodic pulses, a 'galvanostatic' or 'potentiostatic' pulse, or a square wave or modulated sine wave pulse. During PPR plating, the current may preferably include at least one reverse current. This is because the plating layer is etched when the reverse current is applied, thereby reducing the thickness of the plating layer on the insulating layer 20.

The first plating layer 110 formed by PPR plating may include a metal material. Here, the metal material may be copper (Cu), aluminum (Al), silver (Ag), tin (Sn), gold (Au), nickel (Ni), lead (Pb), titanium (Ti), or alloys thereof.

Since the first plating layer 110 is formed by PPR plating, the first plating layer 110 may have a large grain boundary, a high plating growth rate, a good pattern-following property, the pattern-following property indicating a degree to which the plating layer grows along a circuit pattern, and a small plating imbalance. In addition, when the second plating layer 120 is formed on the first plating layer 110 by direct current plating, the surface smoothness of the plating layer can be improved by using a small grain boundary property of the direct current plating. The PPR plating layer may have a larger grain boundary, as compared to the current plating layer. The PPR plating layer may also have a larger grain size, as compared to the current plating layer. Accordingly, the grain boundary may be larger in the PPR plating layer, and thus, the PPR plating layer may have a higher growth rate and a smaller plating deviation, thereby increasing the productivity of the plating layer.

Using PPR plating, the first plating layer 110 may be disposed to extend in the through-hole 40 in the width direction W of the through-hole 40 to divide the through-hole 40 into first and second areas 41 and 42. In this case, the first plating layer 110 disposed in the through-hole 40 may have a thickness t decreasing toward the center portion of the through-hole 40 in the width direction W thereof. In other words, the thickness t of the first plating layer 110 may be smallest in the center portion of the through-hole 40 in the width direction W thereof.

The plugs 210 and 220 may be disposed in the through-hole 40 after plating for forming the first plating layer 110. Accordingly, the plugs 210 and 220 may be disposed in the through-hole 40, excluding an area in which the first plating layer 110 is disposed. Therefore, the plugs 210 and 220 may be disposed in the first and second areas 41 and 42 separated by the first plating layer 110 in the through-hole 40. The plugs 210 and 220 may be disposed by applying or filling a plugging ink formed of an insulating ink material paste into the first and second areas 41 and 42 separated by the first plating layer 110, respectively. Surfaces of the plugs 210 and 220 that are not in contact with the first plating layer 110 may be polished by a polishing brush or buff, and accordingly, the plugs 210 and 220 may have a high roughness. By performing the polishing, the surfaces of the plugs 210 and 220 may be on the same plane as that of the first plating layer 110.

The plugs 210 and 220 used in the printed circuit board 100 according to the present disclosure may include an insulating material, e.g. a resin.

The plugs 210 and 220 disposed by filling the first and second areas 41 and 42, respectively, make it possible to effectively prevent a problem in which voids or unfilled areas are generated in the through-hole 40, as compared with a plug disposed in the entire through-hole 40. This problem is more prominent as the core substrate 10 is thicker. However, in the printed circuit board 100 according to the present disclosure, even though the core substrate is thick, the above-described structure makes it possible to effectively prevent defects such as the generation of areas that are void of or unfilled with the plug. In addition, since an area to be filled by one-time plugging is reduced by more than half, plugging each time can be simplified, and a yield can be improved resulting from the prevention of defects.

The second plating layers 120 may be disposed on the plugs 210 and 220 and the first plating layers 110 after disposing the plugs 210 and 220. As a material of the second plating layers 120, a metal material may be used. Here, the metal material may be copper (Cu), aluminum (Al), silver (Ag), tin (Sn), gold (Au), nickel (Ni), lead (Pb), titanium (Ti), or alloys thereof.

The second plating layers 120 may be formed using PPR plating, like the first plating layers 110, or formed by direct current (DC) electrolytic plating, after electroless plating. As a result, each of the second plating layers 120 may include a seed layer, which is an electroless plating layer, and an electrolytic plating layer, which is formed on the basis of the seed layer.

When the second plating layer 120 is formed by direct current (DC) electrolytic plating, the second plating layer 120 may have a smaller grain size than the first plating layer 110 formed by PPR plating, and thus have a relatively smaller grain boundary than the first plating layer 110. Thus, when the second plating layer 120 is deposited on a surface of a circuit on which a component is to be mounted, the surface of the circuit can be planarized and the problem of unevenness can be prevented.

A circuit pattern 130 may be formed by patterning the metal layer 30, the first plating layer 110, and the second plating layer 120, and may perform various functions according to the design. For example, the circuit pattern 130 may include a ground pattern, a power pattern, a signal pattern, and the like. The circuit pattern 130 may have a line, plane, or pad shape. The circuit pattern 130 may be formed by plating such as an additive process (AP), a semi additive process (SAP), a modified semi additive process (MSAP), or tenting (TT), and each of the first and second plating layers 110 and 120 may include a seed layer, which is an electroless plating layer, and an electrolytic plating layer, which is formed on the basis of the seed layer.

Hereinafter, the process of manufacturing the printed circuit board 100 according to the present disclosure will be described in more detail.

Figure 4:
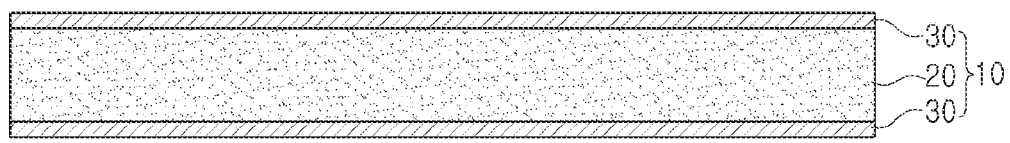
FIG. 4 is a cross-sectional view schematically illustrating an example of a core substrate.

FIG. 4 is a cross-sectional view schematically illustrating an example of the core substrate.

Referring to FIG. 4, first of all, a core substrate 10 is prepared. The core substrate 10 may be used as a core layer and may be a copper clad laminate (CCL) including an insulating layer 20 and metal layers 30.

Figure 5:
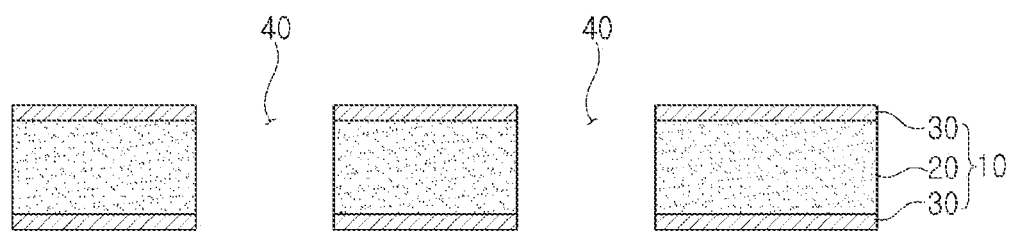
FIG. 5 is a cross-sectional view schematically illustrating a structure in which the core substrate of FIG. 4 is processed to form a through-hole therein.

FIG. 5 is a cross-sectional view schematically illustrating a structure in which the core substrate of FIG. 4 is processed to form a through-hole therein.

Referring to FIG. 5, the core substrate 10 is processed to form a through-hole 40 penetrating through both surfaces of the core substrate 10. When forming the through-hole 40, a common through-hole or via hole processing method may be used. Meanwhile, the through-hole 40 may be formed by a mechanical drilling technique such as a bit or a router. In particular, when the core substrate 10 is relatively thick, the mechanical drilling method using a CNC drilling technique may be effectively applied.

When the through-hole 40 is formed through CNC drilling rather than laser processing, the through-hole 40 may have a relatively constant width, as compared with that formed by the laser processing. Thus, the through-hole 40 may have a substantially constant width, diameter, or cross-sectional area in the thickness direction T thereof.

Figure 6:
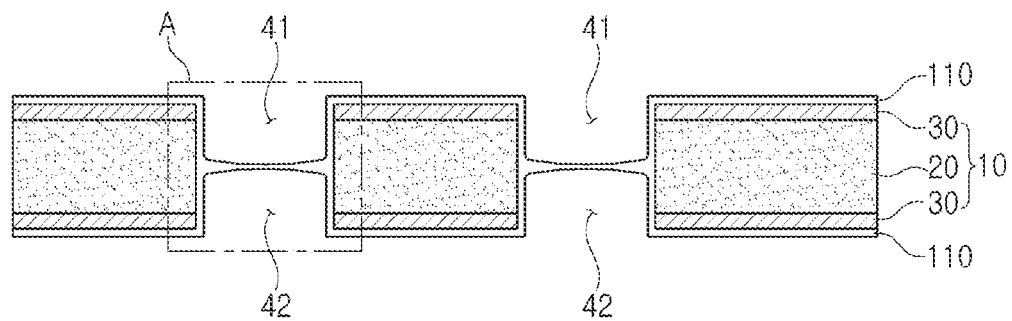
FIG. 6 is a cross-sectional view schematically illustrating a structure in which first plating layers are disposed on the core substrate of FIG. 5.
Figure 7:
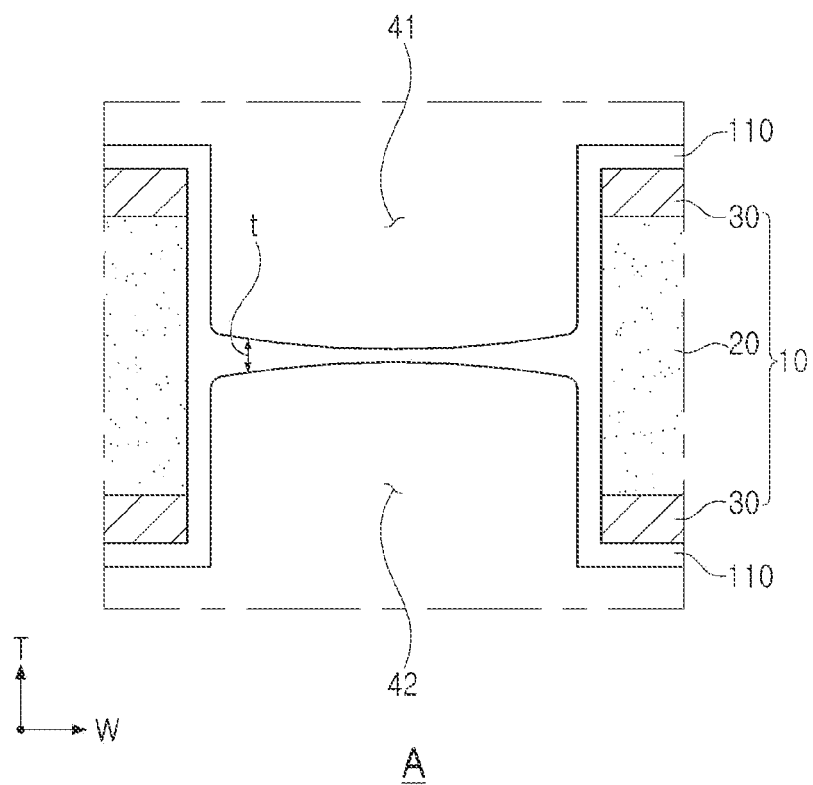
FIG. 7 is an enlarged view schematically illustrating area A of FIG. 6.

FIG. 6 is a cross-sectional view schematically illustrating a structure in which first plating layers are disposed on the core substrate of FIG. 5, and FIG. 7 is an enlarged view schematically illustrating area A of FIG. 6.

The first plating layers 110 may extend to be disposed on the inner wall of the through-hole 40 and on the respective metal layers 30, and may be disposed to be connected to each other inside the through-hole 40 to divide the through-hole 40 into first and second areas 41 and 42, respectively. As described above, the first plating layers 110 may be disposed through PPR plating after electroless plating, and thus may include a seed layer, which is an electroless plating layer, and a PPR plating layer, which is disposed on the seed layer. By forming the first plating layer 110 through PPR plating, the first plating layers 110 may include relatively large-size crystal grains, as compared to DC plating layers.

The first plating layer 110 may be connected to each other in a center portion of the through-hole 40 in a thickness direction T thereof to divide the through-hole 40 into the first and second areas 41 and 42. In addition, in the area where the first plating layers 110 are disposed in the through-hole 40, plating may be performed the least in the center portion of the through-hole 40 in the width direction thereof. Thus, the first plating layer 110 may be thinner in the center portion of the through-hole 40 in the width direction thereof than in the other portion of the through-hole 40 in the width direction thereof.

The first plating layer 110 may include an electroless plating layer through chemical copper plating that is primarily performed and a PPR plating layer through PPR plating that is secondarily performed, and a metal material used therefor may include copper (Cu), aluminum (Al), silver (Ag), tin (Sn), gold (Au), nickel (Ni), lead (Pb), titanium (Ti), or alloys thereof. Since the first plating layer 110 is formed by PPR plating, the first plating layer 110 may have a large grain boundary, a high plating growth rate, a good pattern-following property, the pattern-following property indicating a degree to which the plating layer grows along a circuit pattern, and a small plating imbalance. In addition, when the second plating layer 120 is formed on the first plating layer 110 by direct current plating, the surface smoothness of the plating layer can be improved by using a smaller grain boundary property of the direct current plating. The PPR plating layer may also have a larger grain size, as compared to the current plating layer. Accordingly, the grain boundary may be larger in the PPR plating layer and, thus, the PPR plating layer may have a higher growth rate and a smaller plating deviation, thereby increasing the productivity of the plating layer.

Figure 8:
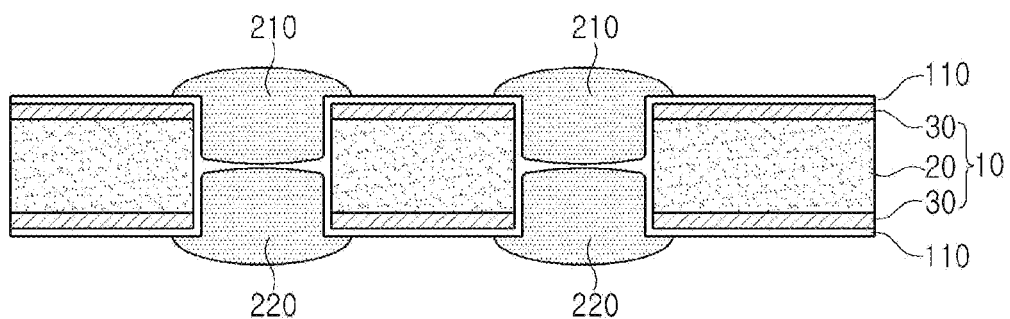
FIG. 8 is a cross-sectional view schematically illustrating a structure in which plugs are disposed in the structure of FIG. 7.

FIG. 8 is a cross-sectional view schematically illustrating a structure in which plugs are disposed in the structure of FIG. 7.

The plugs 210 and 220 may be disposed in the first and second areas 41 and 42 of the through-hole 40, respectively. Since the through-hole 40 is divided by the first plating layers 110, and the plugs 210 and 220 are disposed in the first and second areas 41 and 42, respectively, the occurrence of voids can be reduced, and the problem of defects resulting from unfilled areas can be addressed, as compared with a case where the plugs 210 and 220 are disposed in a lump in the entire through-hole 40.

In addition, as compared with the case where the plugs 210 and 220 are disposed in a lump in the entire through-hole 40, since the first plating layers 110 are disposed in the center portion of the through-hole 40 in the thickness direction T thereof, a plating area is increased, thereby improving reliability and preventing signal loss at the time of transmitting electrical signals through the first plating layers 110.

The plugs 210 and 220 may be disposed by applying and/or filling a plugging ink including an insulating material into the first and second areas 41 and 42, respectively. The plugging ink may include a common insulating material, e.g., a resin, but is not limited thereto, and a filler may be included in the resin. Also, the plugging ink may include any other common insulating material.

Figure 9:
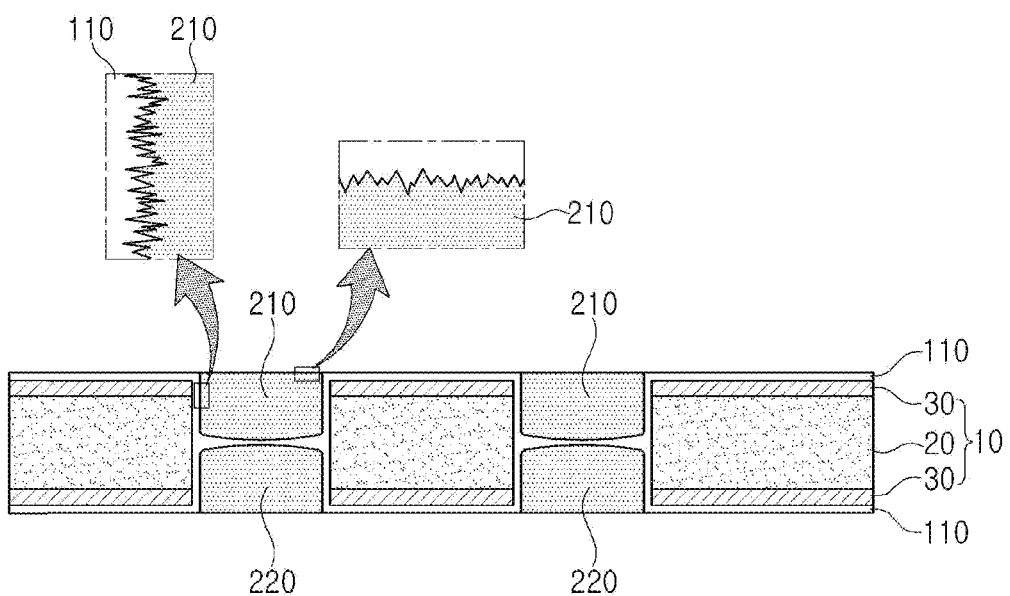
FIG. 9 is a cross-sectional view schematically illustrating a structure in which brushing is performed on the structure of FIG. 8.

FIG. 9 is a cross-sectional view schematically illustrating a structure in which brushing is performed on the structure of FIG. 8.

Referring to FIG. 9, the plugs 210 and 220 disposed in FIG. 8 may be polished for planarization. Brushing is optionally performed only when the plugs 210 and 220 protrude outside the insulating material, and a polishing brush or buff is used for brushing to remove and planarize the plugs 210 and 220 protruding outside the first plating layers 110. At this time, the first plating layers 110 may also be partially polished together with the plugs 210 and 220. Through polishing, surfaces of the first plating layers 110 and the plugs 210 and 220 may have a relatively high roughness. Therefore, among the surfaces of the plugs 210 and 220, the roughness may be relatively lower in areas that are not in contact with the first plating layers 110, that is, areas on which polishing is performed, than in areas that are in contact with the first plating layers 110.

Figure 10:
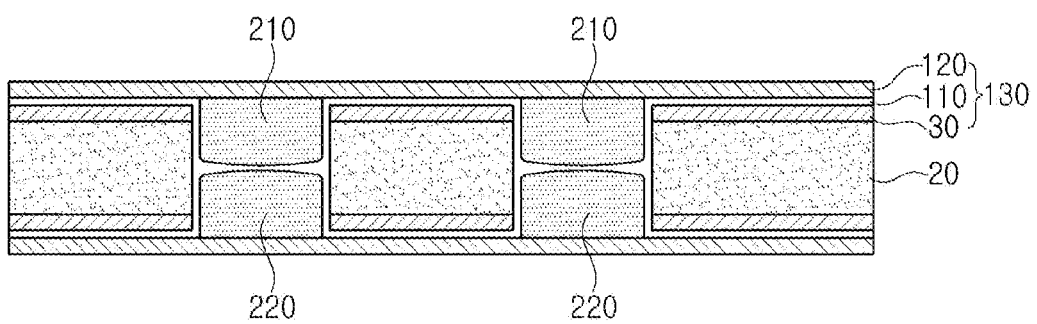
FIG. 10 is a cross-sectional view schematically illustrating a structure in which second plating layers are disposed in the structure of FIG. 9.

FIG. 10 is a cross-sectional view schematically illustrating a structure in which second plating layers are disposed in the structure of FIG. 9.

The second plating layers 120 may be disposed on the plugs 210 and 220 and the first plating layers 110 after polishing the plugs 210 and 220. As a material of the second plating layers 120, a metal material may be used. Here, the metal material may be copper (Cu), aluminum (Al), silver (Ag), tin (Sn), gold (Au), nickel (Ni), lead (Pb), titanium (Ti), or alloys thereof.

The second plating layers 120 may be formed using PPR plating, like the first plating layers 110, or formed by direct current (DC) electrolytic plating, after electroless plating. As a result, each of the second plating layers 120 may include a seed layer, which is an electroless plating layer, and an electrolytic plating layer, which is formed on the basis of the seed layer.

When the second plating layer 120 is formed by direct current (DC) electrolytic plating, the second plating layer 120 may have a smaller grain size than the first plating layer 110 formed by PPR plating, and thus have a relatively smaller grain boundary than the first plating layer 110. Thus, when the second plating layer 120 is deposited on a surface of a circuit on which a component is to be mounted, the surface of the circuit can be planarized and the problem of unevenness can be prevented.

On the other hand, when the second plating layer 120 is formed by PPR plating, like the first plating layer 110, the second plating layer 120 may have a large grain size as in the first plating layer 110. Accordingly, the grain boundary may be large in the PPR plating layer, and thus, the PPR plating layer may have a high growth rate and a small plating deviation, thereby increasing the productivity of the plating layer.

Thereafter, through patterning, the printed circuit board 100 according to the present disclosure as illustrated in FIG. 3 may be obtained. A circuit pattern 130 formed through patterning may be formed by patterning the metal layer 30, the first plating layer 110, and the second plating layer 120, and may perform various functions according to the design. For example, the circuit pattern 130 may include a ground pattern, a power pattern, a signal pattern, and the like. The circuit pattern 130 may have a line, plane, or pad shape. The circuit pattern 130 may be formed by plating such as AP, SAP, MSAP, or TT, and each of the first and second plating layers 110 and 120 may include a seed layer, which is an electroless plating layer, and an electrolytic plating layer, which is formed on the basis of the seed layer.

Referring to FIG. 3, it is illustrated that the circuit pattern 130 is disposed in one layer on each of both sides of the insulating layer 20. However, in order to form a multilayer build-up structure, additional insulating layers, plating layers, and plugs may be built up, or insulating layers and plating layers may be disposed excluding plugs. In addition, a solder resist for protecting the circuit pattern 130 and the insulating layer 20 may be further disposed on the outermost layer of the printed circuit board 100. The solder resist may have openings at least partially exposing the circuit pattern 130, and solder balls or bumps may be disposed in the openings and electrically connected to external connection elements such as other external devices and packages, and the like.

As set forth above, according to the exemplary embodiment in the present disclosure, it is possible to provide a printed circuit board that is advantageous in preventing the occurrence of voids in the through-hole.

In addition, it is possible to provide a printed circuit board in which a plating area in the through-hole is increased to improve reliability at the time of transmitting signals.

While exemplary embodiments have been shown and described above, it will be apparent to those skilled in the art that modifications and variations could be made without departing from the scope of the present invention as defined by the appended claims.

What is claimed is:

1. A printed circuit board comprising:
    an insulating layer having one surface and the other surface;
    metal layers respectively disposed on the one surface and the other surface of the insulating layer;
    a through-hole penetrating through the insulating layer and the metal layers;
    a first plating layer disposed in the through-hole to divide the through-hole into first and second areas;
    a plug disposed in the through-hole; and
    a second plating layer disposed on the first plating layer and the plug,
    wherein an average crystal grain size of the first plating layer is greater than that of the second plating layer, a portion of the first plating layer having the relatively greater average crystal grain size is not located in a region outside of any portion of the second plating layer having the relatively less average crystal grain size, with respect to the insulating layer in a stacking direction of the first and second plating layers, the plug has an outer surface whose roughness is lower in an area that is not in contact with the first plating layer than in an area that is in contact with the first plating layer, and the plug includes a resin.

2. The printed circuit board of claim 1, wherein the first plating layer is disposed in a center portion of the through-hole in a thickness direction thereof.

3. The printed circuit board of claim 1, wherein the first plating layer extends to be disposed on an inner wall of the through-hole and on each of the metal layers.

4. The printed circuit board of claim 1, wherein the plug is disposed in each of the first and second areas.

5. The printed circuit board of claim 1, wherein the plug is disposed to protrude from a surface of the insulating layer.

6. The printed circuit board of claim 1, wherein a portion of the first plating layer extending on the metal layer and the plug are coplanar.

7. The printed circuit board of claim 1, wherein the through-hole has a substantially constant diameter in a thickness direction thereof.

8. The printed circuit board of claim 1, wherein the first plating layer disposed inside the through-hole has a thickness that is minimum in a center portion of the through-hole in a width direction thereof.

9. The printed circuit board of claim 1, wherein the first plating layer is formed by pulse plating, and the second plating layer is formed by direct current (DC) electrolytic plating.

10. A printed circuit board comprising:
an insulating layer;
a plurality of through-holes penetrating through the insulating layer;
a plurality of plugs disposed in each of the plurality of through-holes, respectively;
a first plating layer penetrating through each of the plurality of plugs; and
a second plating layer disposed on the first plating layer and one of the plurality of plugs,
wherein an average crystal grain size of the first plating layer is greater than that of the second plating layer,
a portion of the first plating layer having the relatively greater average crystal grain size is not located in a region outside of any portion of the second plating layer having the relatively less average crystal grain size, with respect to the insulating layer in a stacking direction of the first and second plating layers,
the one of the plurality of plugs has an outer surface whose roughness is lower in an area that is not in contact with the first plating layer than in an area that is in contact with the first plating layer, and
the one of the plurality of plugs includes a resin.

11. The printed circuit board of claim 10, further comprising a metal layer disposed on the insulating layer;
wherein the first plating layer extends to be disposed on an inner wall of each of the plurality of through-holes and on the metal layer.

12. The printed circuit board of claim 10, further comprising a second plating layer disposed on the plurality of plugs and the first plating layer.

13. The printed circuit board of claim 10, wherein the first plating layer disposed inside each of the plurality of plugs has a thickness that is smaller toward a center portion of each of the plurality of plugs in a width direction thereof.

14. The printed circuit board of claim 10, wherein the first plating layer is formed by pulse plating, and the second plating layer is formed by direct current (DC) electrolytic plating.

15. A printed circuit board comprising:
an insulating layer;
a through-hole penetrating through the insulating layer;
a conductive layer disposed at least in the through-hole;
a first plug and a second plug disposed in the through-hole and separated from each other by the conductive layer; and
a metal layer disposed on one or more of the first plug and the second plug,
wherein an average crystal grain size of the conductive layer is greater than that of the metal layer,
a portion of the conductive layer having the relatively greater average crystal grain size is not located in a region outside of any portion of the metal layer having the relatively less average crystal grain size, with respect to the insulating layer in a stacking direction of the insulating layer and the conductive layer, and
the one or more of the first plug and the second plug includes a resin, and has an outer surface whose roughness is lower in an area that is not in contact with the conductive layer than in an area that is in contact with the conductive layer.

16. The printed circuit board of claim 15, wherein the first plug and the second plug include an insulating material.

17. The printed circuit board of claim 15, wherein the conductive layer extends from a portion between the first plug and the second plug to cover one or more of an upper surface and a lower surface of the insulating layer, and the metal layer is in contact with a portion of the conductive layer disposed on the one or more of the upper surface and the lower surface of the insulating layer.

18. The printed circuit board of claim 15, wherein the conductive layer disposed inside the through-hole has a thickness that is smaller toward a center portion of the through-hole in a width direction of the through-hole.

* * * * *